(12) United States Patent
Osanai

(10) Patent No.: US 7,352,046 B2
(45) Date of Patent: Apr. 1, 2008

(54) SEMICONDUCTOR INTEGRATED CIRCUIT DEVICE

(75) Inventor: Jun Osanai, Chiba (JP)

(73) Assignee: Seiko Instruments Inc. (JP)

(*) Notice: Subject to any disclaimer, the term of this patent is extended or adjusted under 35 U.S.C. 154(b) by 0 days.

(21) Appl. No.: 11/199,293

(22) Filed: Aug. 8, 2005

(65) Prior Publication Data

US 2006/0033159 A1    Feb. 16, 2006

(30) Foreign Application Priority Data

Aug. 10, 2004    (JP) ............................ 2004-233806

(51) Int. Cl.
*H01L 23/58* (2006.01)
(52) U.S. Cl. ...................................... 257/492
(58) Field of Classification Search ............... 438/290; 257/300–316, 212–213, 262–263, 488–492, 257/E29.027
See application file for complete search history.

(56) References Cited

U.S. PATENT DOCUMENTS 5,753,553 A * 5/1998 Hikawa et al. ............. 438/278
6,696,340 B2 * 2/2004 Furuhata .................... 438/257
2005/0190628 A1 * 9/2005 Osanai ....................... 365/226

* cited by examiner

*Primary Examiner*—Nathan W Ha
(74) *Attorney, Agent, or Firm*—Adams & Wilks

(57) ABSTRACT

A semiconductor integrated circuit device has a first MOS transistor having an insulating film, a first source, a first gate electrode, and a nitride film overlapping the first gate electrode from the first source through the insulating film. A second MOS transistor has a second source and a second gate electrode but does not have a nitride film overlapping the second gate electrode from the second source.

20 Claims, 5 Drawing Sheets

SEMICONDUCTOR INTEGRATED CIRCUIT DEVICE

BACKGROUND OF THE INVENTION

1. Field of the Invention

The present invention relates to an analog semiconductor integrated circuit device having a sensor or a power management function.

2. Description of the Related Art

When an analog semiconductor integrated circuit device having a sensor or a power management function is composed of MOS transistors, a so called multi-Vth method, in which plural threshold voltages (hereinafter, referred to as Vth) of the MOS transistor, instead of one, are used, is generally applied in order to carry out complicated analog signal processing and to cover various input voltage ranges.

In a conventional semiconductor integrated circuit device as shown in FIGS. 5A and 5B, Vth value of a MOS transistor is determined by ion implantations 203 and 205. A plurality of photolithography steps and a plurality of ion implanting steps are performed to form a multi-Vth device (For example., refer to JP 2000-323587 A (p. 6, FIG. 2)).

In the prior art, a plurality of photolithography steps and a plurality of ion implanting steps to attain a multi-Vth device have increased the cost for manufacturing and have prolonged a manufacturing period, which results in a problem with product delivery. Further, since the number of steps cannot be increased unnecessarily, it is essentially impossible to attain multi-Vth having sufficiently many threshold voltages.

SUMMARY OF THE INVENTION

In order to solve the above problems, the present invention employs the following means:

(1) A semiconductor integrated circuit device, including: a first MOS transistor in which a nitride film is arranged to overlap with a source of the first MOS transistor and a gate electrode thereof through an insulating film; and a second MOS transistor in which a nitride film does not overlap with a source of the second MOS transistor and a gate electrode thereof.

(2) A semiconductor integrated circuit device, wherein an overlap ratio of the nitride film, which overlaps with the gate electrode of the first MOS transistor, to a channel width takes an arbitrary value between 0 and 1.

(3) A semiconductor integrated circuit device, wherein an overlap amount of the nitride film, which overlaps with the gate electrode of the first MOS transistor, with respect to the gate electrode is equal to or greater than 0.2.

(4) A semiconductor integrated circuit device, wherein an overlap amount of the nitride film of the first MOS transistor with respect to the source is equal to or greater than 0.2 μm.

(5) A semiconductor integrated circuit device, wherein the nitride film has a thickness of equal to or greater than 50 nm.

According to the present invention, only adding one step can attain a multi-Vth device, and the product delivery can remain at the same level as in the case of the product that uses a non-multi-Vth method. The detailed mechanism will be described later.

DETAILED DESCRIPTION OF THE PREFERRED EMBODIMENTS

Description will be made of embodiments of the present invention with reference to the drawings.

Embodiment 1

Figure 1:
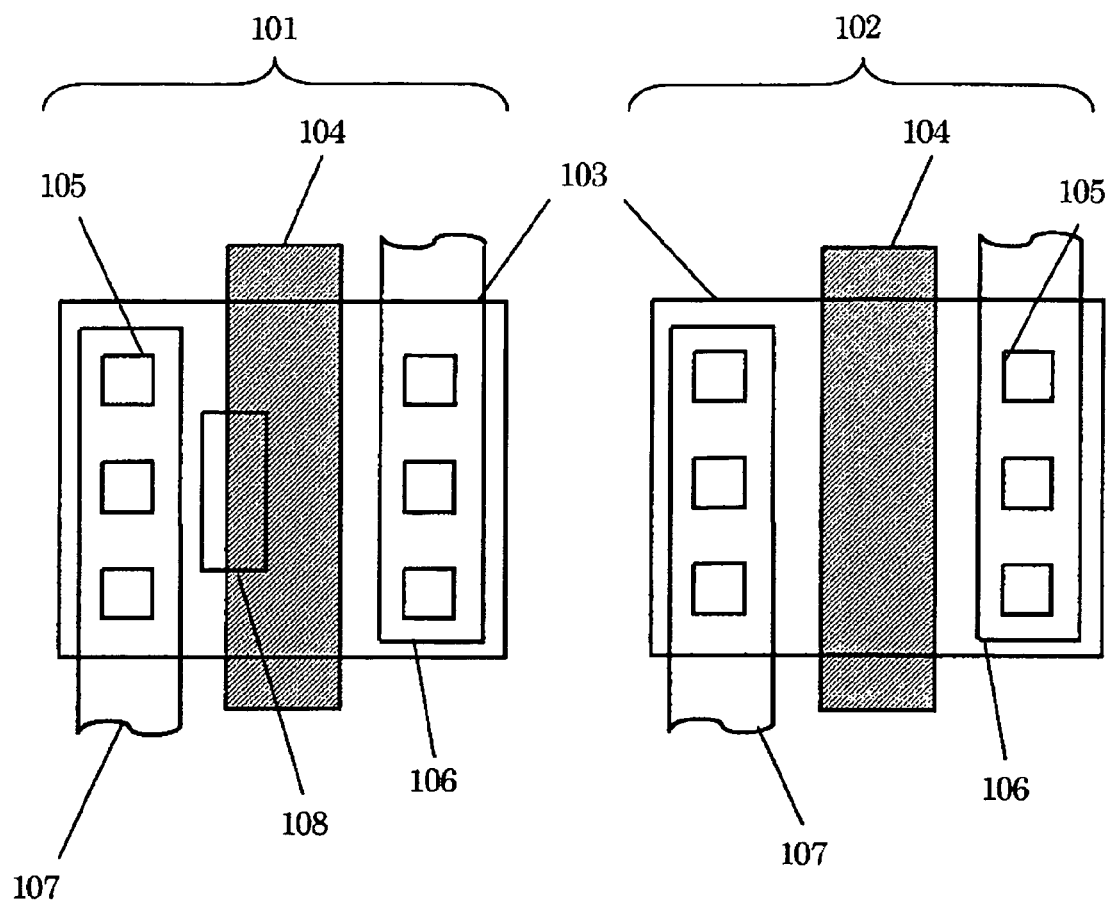
FIG. 1 is a schematic plan view showing Embodiment 1 of the present invention.

FIG. 1 is a schematic plan view showing Embodiment 1 of the present invention. FIG. 1 shows a first MOS transistor 101, which includes: an active region 103 that defines a region of the MOS transistor; a gate electrode 104 of the MOS transistor; a contact 105 that electrically connects a source or a drain of the MOS transistor with a wiring metal; and a source wiring metal 107 and a drain wiring metal 106, and also shows a second MOS transistor 102 including the same components as those of the first MOS transistor.

A difference between the first MOS transistor and the second MOS transistor is that the first MOS transistor has a nitride film 108 arranged to extend over the gate electrode and the source. The nitride film is generally not arranged as shown in the second MOS transistor. When a nitride film is arranged to overlap with both the gate electrode and the source, Vth increases in an N-channel MOS while Vth decreases in a P-channel MOS. That is, an absolute value of Vth increases in both cases. In a MOS transistor, an interface trap generally exists at the interface between the semiconductor substrate and the gate insulating film, and the interface trap has a high density in an overlap region of the gate electrode and the source or drain. In a sintering process in an atmosphere containing hydrogen that proceeds an alloying reaction between a wiring metal and a semiconductor or in the formation of a protection film containing hydrogen such as a plasma nitride film, hydrogen diffuses through the insulating film and reaches the interface between the semiconductor substrate and the gate insulating film to terminate the interface level to lower the trap density.

When the nitride film 108 is formed by low-pressure CVD and is arranged to overlap with the gate electrode and the source, the nitride film suppresses hydrogen diffusion to prevent the interface level density from lowering, and Vth remains high in absolute value in the MOS having the above layout. The present invention utilizes this phenomenon. The first MOS transistor shown in FIG. 1 has a higher Vth in absolute value than that of the second MOS transistor. Accordingly, sufficiently many Vth's can be realized in the same semiconductor integrated circuit by variably designing an overlap amount of the nitride film which overlaps with the gate electrode with respect to a channel width.

Figure 2:
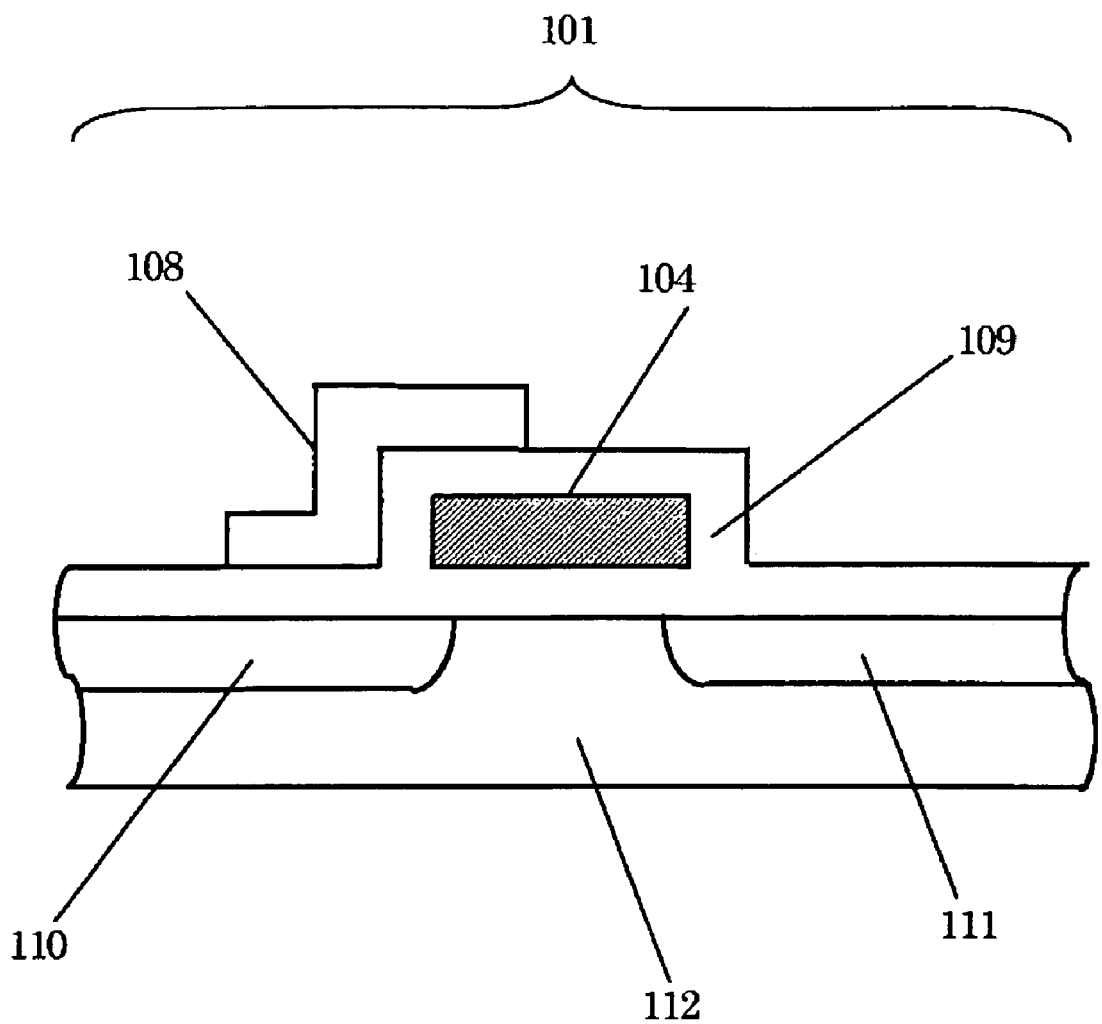
FIG. 2 is a schematic sectional view showing Embodiment 1 of the present invention.

FIG. 2 is a schematic sectional view of the first MOS transistor of the present invention. The nitride film 108 is arranged on both the gate electrode 104 and a source diffusion region 110 through an insulating film 109 formed by thermal oxidation or CVD. Such a sectional structure can prevent the interface trap having high density from being terminated by hydrogen in the overlap region of the gate electrode and the source. Hydrogen diffusion can be suppressed with the nitride film having a thickness equal to or greater than 50 nm.

Figure 3:
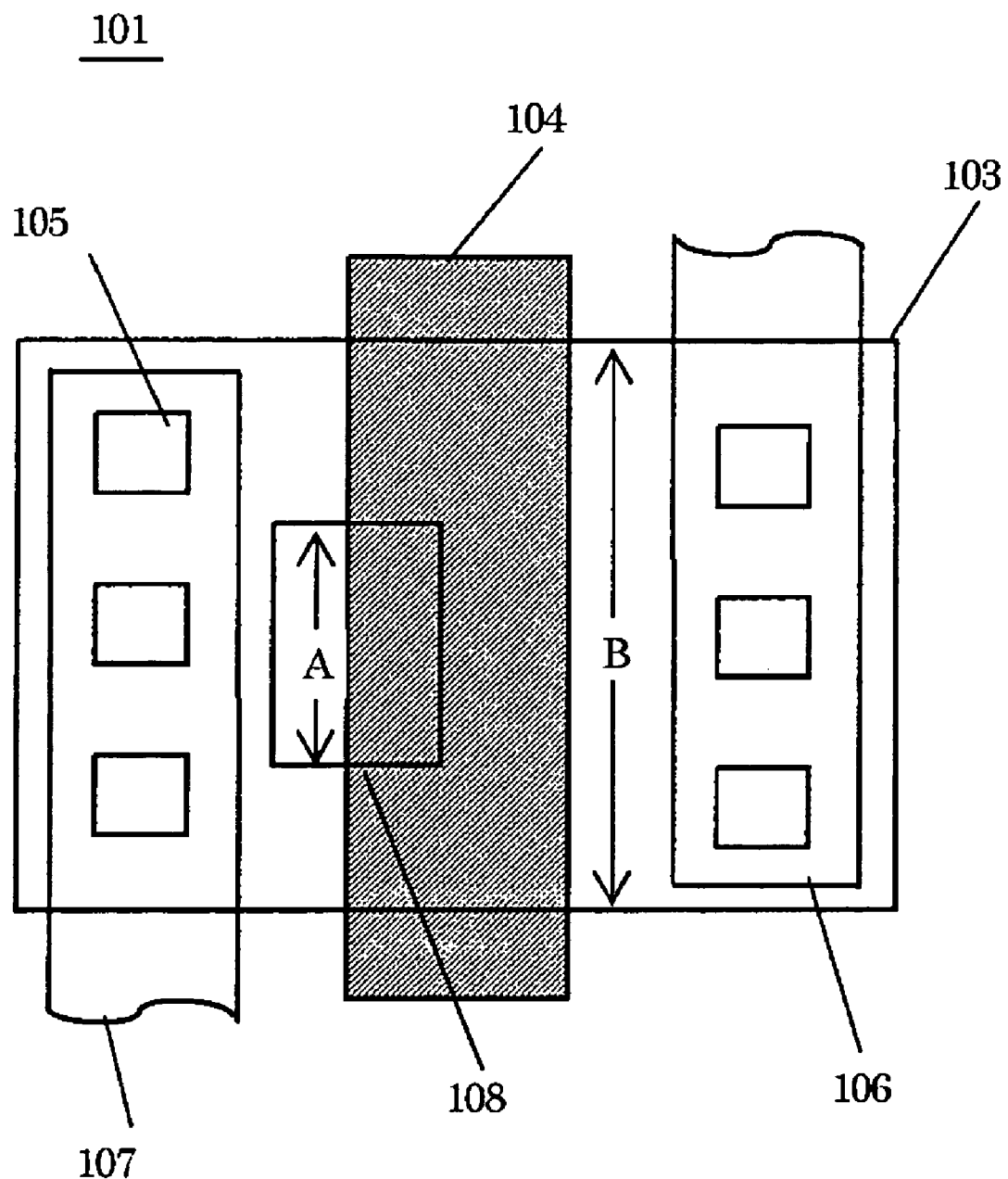
FIG. 3 is an enlarged schematic plan view showing Embodiment 1 of the present invention.

FIG. 3 is an enlarged plan view of the first MOS transistor of the present invention. Threshold voltage Vth is variable in accordance with a channel width B and an overlap amount A of the nitride film with respect to the gate electrode in a channel width direction. In the case of A/B=100%, Vth increases by about 0.3 V in comparison with the MOS transistor having no overlap, although it depends on the thickness of the gate insulating film and the concentration of the substrate. In the case of A/B=0, Vth has the same value as in the case of a MOS transistor having no nitride film. The Vth is proportional to the ratio A/B. Sufficient multi-Vth can be realized by changing design values for patterns instead of photo steps and ion implantation steps in the conventional multi-Vth method.

The same effect as above can be obtained even when the nitride film is arranged to overlap the drain and the gate electrode. Increase in Vth is, however, small, when the MOS transistor operates in a saturated region, and it is more effective to arrange the nitride film to overlap the source and the gate electrode. The effect of the present invention can be expected when an overlap amount of the nitride film with respect to the gate electrode and the source is equal to or greater than 0.2 μm.

Embodiment 2

Figure 4:
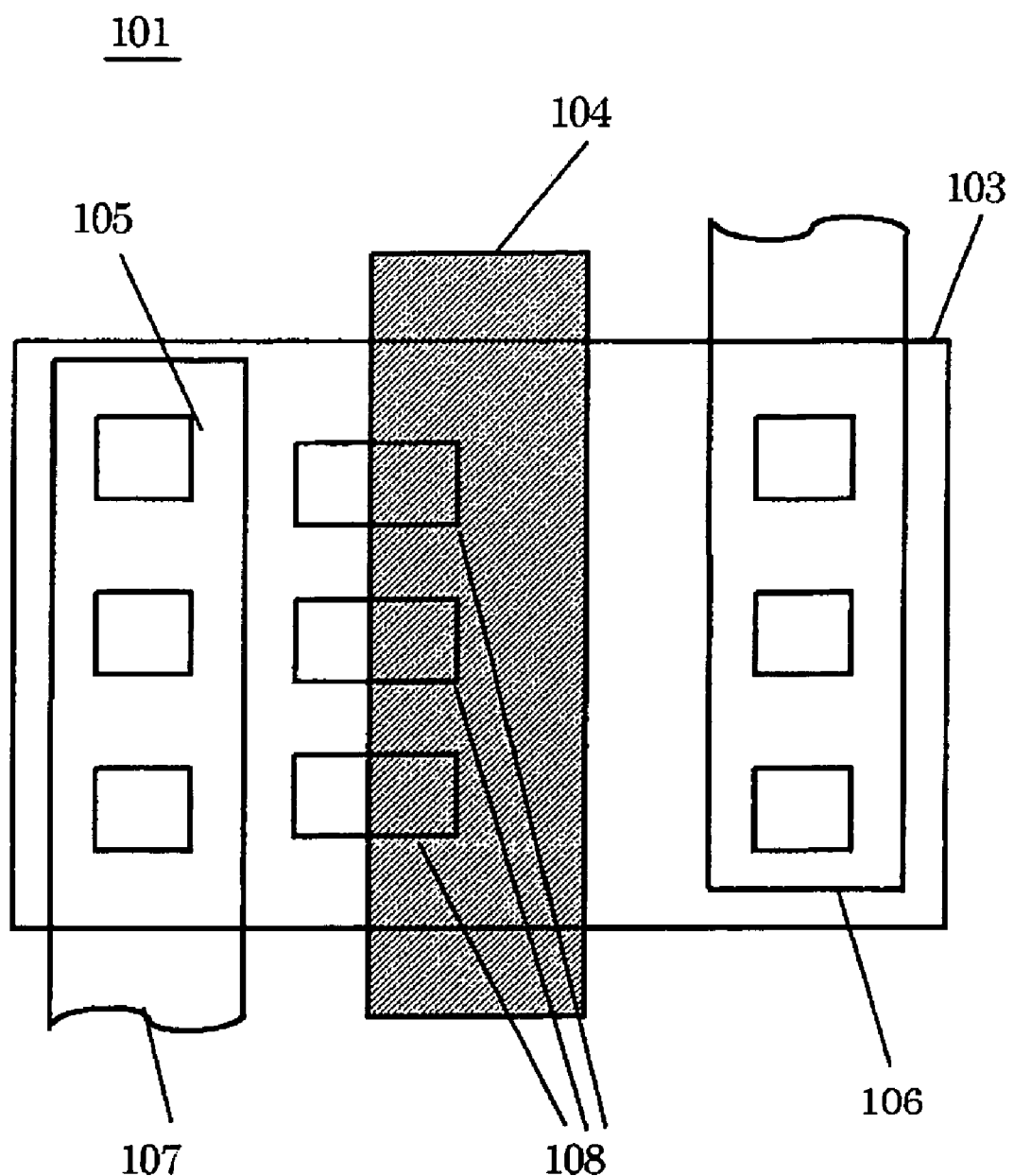
FIG. 4 is a schematic plan view showing Embodiment 2 of the present invention.
Figure 5A:
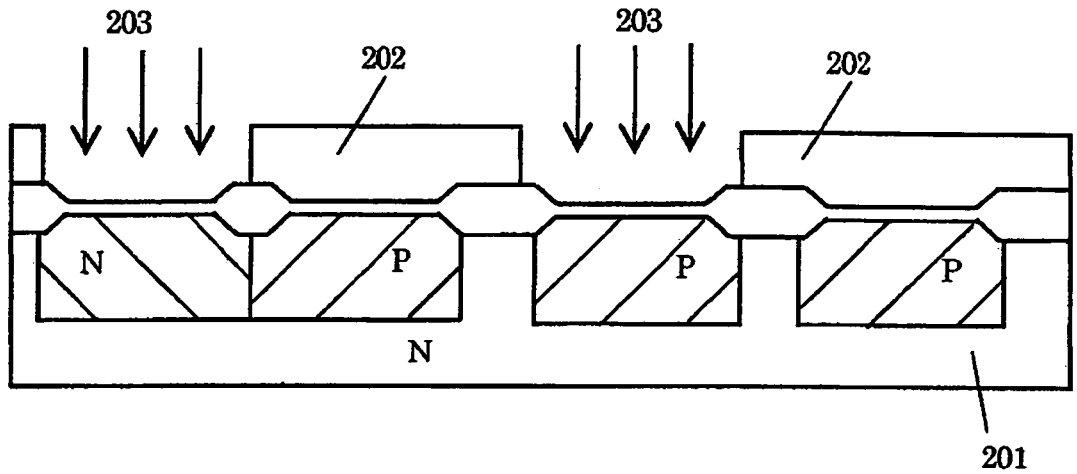
FIGS. 5A and 5B are schematic sectional views showing a conventional example.
Figure 5B:
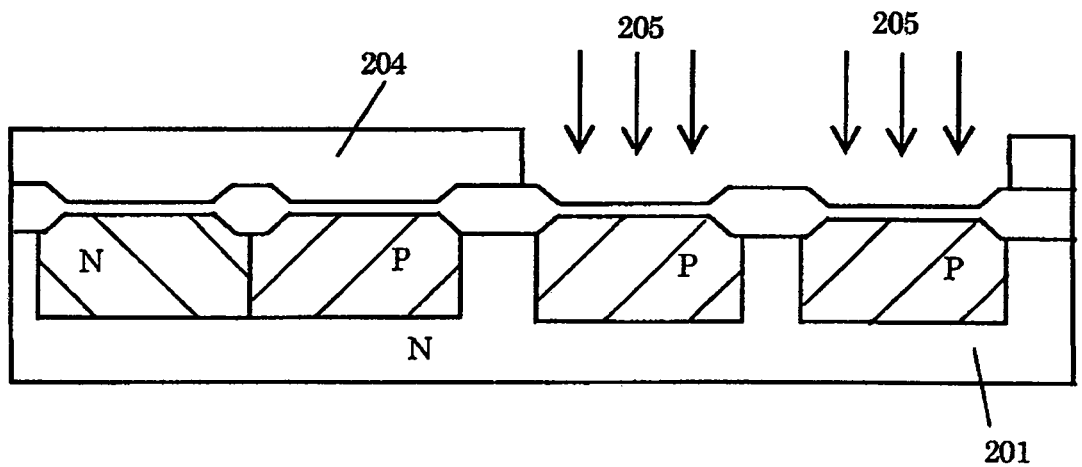

FIG. 4 is a schematic plan view showing Embodiment 2 of the present invention. The difference between Embodiment 1 and Embodiment 2 is that small separated nitride films 108 are arranged to overlap with the gate electrode and the source. The principle is the same as described with reference to FIGS. 1 and 2. Such a layout can also give the same effect.

The present invention can be applied to MOS transistors of both polarities, that is, NMOS and PMOS transistors. Further, the same effect can be obtained in either normally-off enhancement transistor or normally-on depletion transistor.

As described above, according to the present invention, a semiconductor device having sufficiently many Vth's can be realized without increase in cost and in manufacturing period, and an analog semiconductor integrated circuit device with high added value and high function can be provided.

What is claimed is:

1. A semiconductor integrated circuit device, comprising:
   a first MOS transistor having an insulating film, a first source, a first non-floating gate electrode, and a nitride film overlapping the first non-floating gate electrode from the first source through the insulating film for controlling a threshold voltage of the first MOS transistor by inhibiting hydrogen diffusion in an overlap region of the first non-floating gate electrode and the first source; and
   a second MOS transistor having a second source and a second non-floating gate electrode and without a nitride film overlapping the second non-floating gate electrode from the second source.

2. A semiconductor integrated circuit device according to claim 1; wherein a ratio of an amount in which the nitride film overlaps the first non-floating gate electrode to a channel width of the first MOS transistor has a value between 0 and 1.

3. A semiconductor integrated circuit device according to claim 1; wherein an overlap amount of the nitride film with respect to the first non-floating gate electrode is equal to or greater than 0.2 μm.

4. A semiconductor integrated circuit device according to claim 1; wherein an overlap amount of the nitride film with respect to the first source is equal to or greater than 0.2 μm.

5. A semiconductor integrated circuit device according to claim 1; wherein the nitride film has a thickness equal to or greater than 50 nm.

6. A semiconductor integrated circuit device comprising: a first MOS transistor having a first source, a first non-floating gate electrode, and a nitride film overlapping the first source and the first non-floating gate electrode for controlling a threshold voltage of the first MOS transistor by inhibiting hydrogen diffusion in an overlap region of the first non-floating gate electrode and the first source; and a second MOS transistor having a second source and a second non-floating gate electrode.

7. A semiconductor integrated circuit device according to claim 6; wherein a ratio of an amount in which the nitride film overlaps the first non-floating gate electrode to a channel width of the first MOS transistor has a value between 0 and 1.

8. A semiconductor integrated circuit device according to claim 6; wherein an overlap amount of the nitride film with respect to the first non-floating gate electrode is equal to or greater than 0.2 μm.

9. A semiconductor integrated circuit device according to claim 6; wherein an overlap amount of the nitride film with respect to the first source is equal to or greater than 0.2 μm.

10. A semiconductor integrated circuit device according to claim 6; wherein the nitride film has a thickness equal to or greater than 50 nm.

11. A semiconductor integrated circuit device according to claim 6; wherein the second MOS transistor does not have a nitride film overlapping the second source and the second non-floating gate electrode.

12. A semiconductor integrated circuit device according to claim 11; wherein a ratio of an amount in which the nitride film overlaps the first non-floating gate electrode to a channel width of the first MOS transistor has a value between 0 and 1.

13. A semiconductor integrated circuit device according to claim 11; wherein an overlap amount of the nitride film with respect to the first non-floating gate electrode is equal to or greater than 0.2 μm.

14. A semiconductor integrated circuit device according to claim 11; wherein an overlap amount of the nitride film with respect to the first source is equal to or greater than 0.2 μm.

15. A semiconductor integrated circuit device according to claim 11; wherein the nitride film has a thickness equal to or greater than 50 nm.

16. A semiconductor integrated circuit device comprising: a first MOS transistor having a first source, a first non-floating gate electrode, and a plurality of nitride films overlapping the first source and the first non-floating gate electrode for controlling a threshold voltage of the first MOS transistor by inhibiting hydrogen diffusion in an overlap region of the first non-floating gate electrode and the first source; and a second MOS transistor having a second source and a second non-floating gate electrode.

17. A semiconductor integrated circuit device according to claim 16; wherein the second MOS transistor does not have a nitride film overlapping the second source and the second non-floating gate electrode.

18. A semiconductor integrated circuit device according to claim 17; wherein the nitride films are separate and independent from one another.

19. A semiconductor integrated circuit device according to claim 17; wherein the nitride films extend in a length direction of the first non-floating gate electrode.

20. A semiconductor integrated circuit device according to claim 17; wherein each of the nitride films has a thickness equal to or greater than 50 nm.

* * * * *